(12) United States Patent
Fujii et al.

(10) Patent No.: US 6,199,025 B1
(45) Date of Patent: Mar. 6, 2001

(54) SEMICONDUCTOR DEVICE HAVING SELECTABLE DEVICE TYPE AND METHODS OF TESTING DEVICE OPERATION (75) Inventors: Atsushi Fujii; Masaki Okuda, both of Kawasaki (JP)

(73) Assignee: Fujitsu Limited, Kawasaki (JP)

(*) Notice: Subject to any disclaimer, the term of this patent is extended or adjusted under 35 U.S.C. 154(b) by 0 days.

(21) Appl. No.: 09/010,547

(22) Filed: Jan. 22, 1998

(30) Foreign Application Priority Data

Jun. 23, 1997 (JP) ..................................................... 9-165936

(51) Int. Cl.[7] ..................................................... G11C 7/00
(52) U.S. Cl. .................. 702/117; 365/225.7; 365/230.07
(58) Field of Search .............................. 702/117; 365/96, 365/185.18, 200, 225.7, 230.06

(56) References Cited

U.S. PATENT DOCUMENTS 5,563,821 * 10/1996 Kumagai et al. ....................... 365/96
5,615,151 * 3/1997 Furuno et al. .................. 365/185.18
5,933,376 * 8/1999 Lee ....................................... 365/200

* cited by examiner

*Primary Examiner*—Kamini Shah
(74) *Attorney, Agent, or Firm*—Arent Fox Kintner Plotkin & Kahn, PLL (57) ABSTRACT

A semiconductor device includes a device-type switching circuit which determines selection signals A based on fuse-cut conditions in a first mode, and determines selection signals based on control signals supplied thereto in a second mode, and an internal circuit having an operation thereof selected by selection signals from device-type switching circuit.

10 Claims, 6 Drawing Sheets

|     | NORMAL OPERATION | TEST MODE |
|-----|------------------|-----------|
| FX0 | L H L H | * * * * * * * |
| FX1 | H L L H | * * * * * * * |
| S1  | L L L L | H L H L H L H |
| S2  | L L L L | L H H L L H H |
| S3  | L L L L | L L L H H H H |
| DX0 | H L L L | H L H L H L H |
| DX1 | L H L L | L H H L L H H |
| I/O | X4 X8 X16 X16 | X4 X8 X16 X16 X4 X8 X16 |

| | A00 | A01 | A02 | A03 | A04 | A05 | A06 | A07 | A08-A13 | DQ | /RAS | /CAS | /WE | /CS | CKE |
|---|---|---|---|---|---|---|---|---|---|---|---|---|---|---|---|
| DEVICE-TYPE SELECTION ×4 | — | L | L | H | H | L | — | — | — | — | L | L | L | L | Super"H" |
| ×8 | — | H | L | H | H | L | — | — | — | — | L | L | L | L | Super"H" |
| ×16 | — | L | H | H | H | L | — | — | — | — | L | L | L | L | Super"H" |
| CELL-PLATE VOLTAGE BUMP TEST VSS | — | H | L | L | L | L | H | — | — | — | L | L | L | L | Super"H" |
| VCC | — | L | H | L | L | L | H | — | — | — | L | L | L | L | Super"H" |

SEMICONDUCTOR DEVICE HAVING SELECTABLE DEVICE TYPE AND METHODS OF TESTING DEVICE OPERATION

BACKGROUND OF THE INVENTION

1. Field of the Invention

The present invention generally relates to semiconductor devices, and particularly relates to a semiconductor device which allows a device type thereof to be switched.

2. Description of the Related Art

When semiconductor devices are manufactured, they are generally designed to be adaptable to various device types (different operational configurations), and one of the device types is selected and fixed before shipment of the semiconductor devices. For example, an input-output interface is designed such that the input-output interface can be switched between a 4-bit configuration, an 8-bit configuration, a 16-bit configuration, and a 32-bit configuration, thereby allowing a choice to be made at the time of shipment as to the input-output-interface configuration of the semiconductor device. Further, a memory device may be provided with a choice as to how many refresh commands should be input in order to refresh the whole memory cell array, and a desired configuration is selected at the time of shipment of the device.

Such a semiconductor device provided with a selectable device type conventionally uses pads for selecting a device type. This selection is made by bonding a selected pad to a power voltage VCC or a ground voltage VSS.

Figure 1:
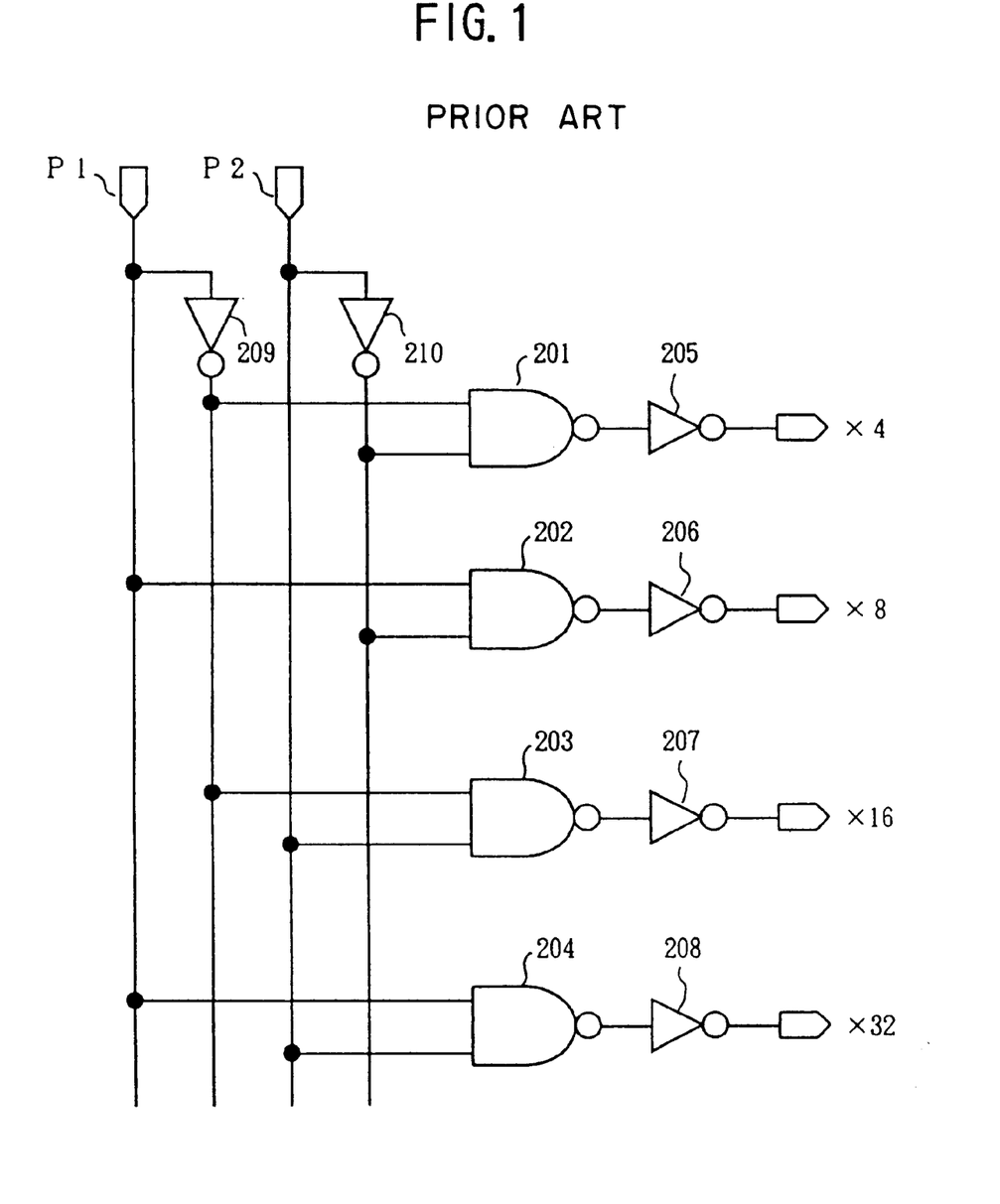
FIG. 1 is a circuit diagram of a device-type switching mechanism of the related art.

FIG. 1 is a circuit diagram of a device-type switching mechanism of the related art.

A device-type switching decoder of FIG. 1 includes NAND circuits 201 through 204, inverters 205 through 210, and pads P1 and P2. Depending on what combination of a HIGH (VCC) voltage and a LOW (VSS) voltage is applied to the pads P1 and P2, one of the inverters 205 through 208 outputs a HIGH signal. The outputs of the inverters 205 through 208 correspond to a 4-bit configuration, an 8-bit configuration, a 16-bit configuration, and a 32-bit configuration of an input-output interface, respectively. Before the shipment of the semiconductor device, the semiconductor device needs to be sealed inside a package. During the sealing process, the pads P1 and P2 are bonded to the power voltage VCC or the ground voltage VSS. After this bonding, a selected one of the inverters 205 through 208 outputs a HIGH signal when the device is operated. The outputs of the inverters 205 through 208 are supplied to an internal circuit (including an input-output interface circuit) of the semiconductor device, so that the semiconductor device operates based on the selected input-output-interface configuration.

A pad occupies a large area. When pads are used for the switching of a device-type, chip size is bound to increase because of the incorporation of the ability to switch a device type. Within a limited chip size, it is difficult to secure a space for these pads, especially when the number of I/O signals is large.

Moreover, there is a need to examine output signals from a semiconductor device while providing various input signals to the semiconductor device in order to make a final check on operations after the bonding is put in place. When a device type is fixed to a 4-bit configuration by bonding pads, for example, the number of input-output-interface bits is one fourth of that of a 16-bit configuration. When the 4-bit configuration is selected, therefore, the check requires a test time four times as long as that of the 16-bit configuration.

Accordingly, there is a need for a semiconductor device which does not use pads for switching a device type.

There is another need for a semiconductor device which can switch a device type even after a device type is once fixed.

There is yet another need for a method of testing a semiconductor device which requires a relatively short time period when the semiconductor device described above is used.

SUMMARY OF THE INVENTION

Accordingly, it is a general object of the present invention to provide a semiconductor device and a test method which can satisfy the needs described above.

It is another and more specific object of the present invention to provide a semiconductor device which does not use pads for switching a device type.

It is yet another object of the present invention to provide a semiconductor device which can switch a device type even after a device type is once fixed.

In order to achieve the above objects, a semiconductor device according to the present invention includes a device-type switching circuit which determines selection signals based on fuse-cut conditions in a first mode, and determines selection signals based on control signals supplied thereto in a second mode, and an internal circuit having an operation thereof selected by selection signals from device-type switching circuit.

In the semiconductor device described above, an operation of the internal circuit is selected based on the fuse-cut conditions in the first mode, so that pad areas can be reduced compared to a case in which an operation is selected by bonding pads. Further, an operation of the internal circuit is selected based on the control signals in the second mode, so that the operation can be switched as it becomes necessary even after the fuses are cut.

According to one aspect of the present invention, the semiconductor device described above is such that the device-type switching circuit includes a fuse circuit which fixes at least one output thereof according to the fuse-cut conditions, and a device-type selecting circuit which receives the at least one output and the control signals, the device-type selecting circuit determining the selection signals based on the at least one output in the first mode and determining the selection signals based on the control signals in the second mode.

In the semiconductor device described above, the fuse circuit for fixing its output according to the fuse-cut conditions is provided, and, also, the devicetype selecting circuit for determining the selection signals based on the output of the fuse circuit or the control signals is provided. This configuration allows an operation of the device to be switched based on the control signals even after the fuses are cut.

According to another aspect of the present invention, the semiconductor device described above is such that the device-type switching circuit selects one of the first mode and the second mode based on the control signals.

In the semiconductor device described above, the control circuit is used for selecting one of the first mode and the second mode.

According to another aspect of the present invention, the semiconductor device described above is such that the internal circuit selects one of a plurality of input-output-interface configurations in accordance with the selection signals.

In the semiconductor device described above, the input-output-interface configurations of the internal circuit can be determined based on the fuse-cut conditions or the control signals.

According to another aspect of the present invention, the semiconductor device described above further includes a mode-check circuit checking whether an operation mode is a normal operation mode or a test operation mode, and a mode-decoder circuit which generates the control signals by decoding input signals supplied from an external source when the operation mode is the test operation mode, wherein the normal operation mode corresponds to the first mode, and the test operation mode corresponds to the second mode.

In the semiconductor device described above, operations in the normal operation mode are performed by using the input-output-interface configuration which is selected based on the fuse-cut conditions, while the input-output-interface configuration can be switched during the test operation mode in accordance with the externally provided input signals. This allows an input-output-interface configuration having a larger number of input-output bits to be used during the test operation mode, thereby reducing a time required for conducting the test.

It is still another object of the present invention to provide a method of testing a semiconductor device which requires a relatively short time period when the semiconductor device described above is used.

In order to achieve the above object according to the present invention, a method of testing operations of a semiconductor device which selects one of input-output-interface configurations based on fuse-cut conditions in a normal operation mode and selects one of the input-output-interface configurations based on input signals in a test operation mode includes the steps of cutting at least one fuse to select a first one of the input-output-interface configurations, inputting a command to specify the test operation mode and to select a second one of the input-output-interface configurations, and testing operations of the semiconductor device by using the second one of the input-output-interface configurations.

In the method described above, an operation test can be conducted while switching the input-output-interface configuration during the test operation mode by using a command input supplied from an external source. This allows an input-output-interface configuration having a larger number of input-output bits to be used during the test operation mode, thereby reducing a time required for conducting the test.

According to one aspect of the present invention, the method described above is such that the second one of the input-output-interface configurations includes a larger number of input-output bits than the first one of the input-output-interface configurations.

In the method described above, an operation test is conducted by selecting an input-output-interface configuration having a larger number of input-output bits, thereby reducing a time required for conducting the test.

The above objects are also achieved by a semiconductor device which determines a device type thereof based on cut conditions of internal fuses in a first mode and determines the device type based on input signals supplied from an external source in a second mode.

In the semiconductor device described above, a device type is selected based on the fuse-cut conditions in the first mode, so that pad areas can be reduced compared to a case in which a device type is selected by bonding pads. Further, a device type is selected based on the input signals in the second mode, so that the device type can be switched as it becomes necessary even after the fuses are cut.

According to one aspect of the present invention, the semiconductor device described above is such that the device type is classified according to input-output-interface configurations.

In the semiconductor device described above, an input-output-interface configuration can be switched as it becomes necessary even after the fuses are cut.

According to another aspect of the present invention, the semiconductor device described above is such that the first mode is a normal operation mode and the second mode is a test operation mode.

In the semiconductor device described above, the input-output-interface can be switched based on the externally provided input signals during the test operation mode even after the fuses are cut. This allows an input-output-interface configuration having a larger number of input-output bits to be used during the test operation mode, thereby reducing a time required for conducting the test.

Other objects and further features of the present invention will be apparent from the following detailed description when read in conjunction with the accompanying drawings.

DESCRIPTION OF THE PREFERRED EMBODIMENTS

In the following, embodiments of the present invention will be described with reference to the accompanying drawings.

Figure 2:
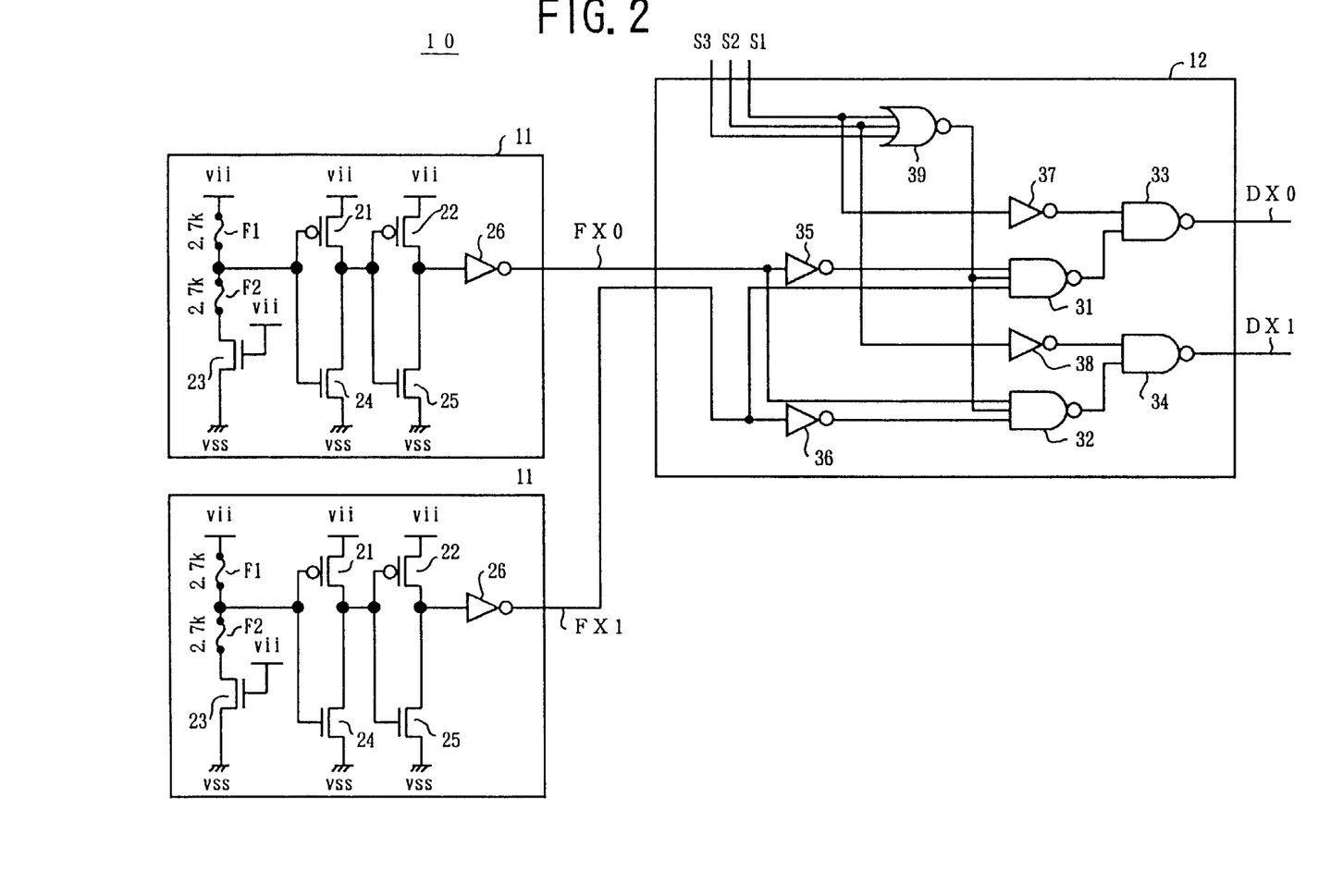
FIG. 2 is a circuit diagram of a device-type switching circuit according to the present invention.

FIG. 2 is a circuit diagram of a device-type switching circuit according to the present invention.

A device-type switching circuit 10 of FIG. 2 includes at least one fuse circuit 11 and a device-type selecting circuit 12. The fuse circuit 11 includes fuses F1 and F2, PMOS transistors 21 and 22, NMOS transistors 23 through 25, and an inverter 26. The device-type selecting circuit 12 includes NAND circuits 31 through 34, inverters 35 through 38, and a NOR circuit 39.

The fuse circuit 11 fixes an output FX0 (or FX1) to HIGH or LOW when one of the fuses F1 and F2 is severed. When the fuse F1 is cut, the output is fixed to HIGH. When the fuse F2 is cut, the output is fixed to LOW.

The device-type selecting circuit 12 receives the output signals FX0 and FX1 from the fuse circuits 11, and outputs device-type selecting signals DX0 and DX1. The device-type selecting signals DX0 and DX1 are supplied to the inputs of the device-type switching decoder of FIG. 1, for example. In this case, the signals are supplied from the device-type selecting circuit 12 inside a semiconductor chip to the device-type switching decoder of FIG. 1 which is also provided inside the semiconductor device. There is no need, therefore, to install the pads P1 and P2.

A combination of the device-type selecting signals DX0 and DX1 determines a device type. Since there are two bits for representing a combination in this case, four device types can be represented at maximum. During a normal operation of the device, the device-type selecting signals DX0 and DX1 of the device-type selecting circuit 12 only depend on a combination of the signals FX0 and FX1. During a test operation, however, the device-type selecting signals DX0 and DX1 of the device-type selecting circuit 12 are dependent only on signals S1 through S3 regardless of the combination of the signals FX0 and FX1. Namely, a combination of the signals S1 through S3 will determine a device type when a test operation is performed.

In this manner, a device type is determined by the fuse circuits 11 during a normal operation, so that a chip area is spared when this chip area would otherwise be used as pad areas for determining a device type through bonding as in the related art. Further, even after the device type is fixed by the fuse circuit 11, the device-type selecting circuit 12 can temporarily change a device type. When an input-output-interface configuration is switched, for example, a test of the device can be conducted in a relatively short time even after a bit configuration is fixed to a configuration of a small number of bits by the fuse circuit 11. That is, the device-type selecting circuit 12 can be used for changing a bit configuration to a larger number of bits during a test operation.

In practice, the device-type switching circuit 10 of FIG. 2 represents only three device types by using the device-type selecting signals DX0 and DX1. That is, the input-output-interface configuration, for example, is comprised of a 4-bit configuration, an 8-bit configuration, and a 16-bit configuration, and one of these three configurations is selected. Corresponding to the three device types, three signals S1 through 53 are provided as input to the device-type selecting circuit 12.

The device-type selecting circuit 12 is placed in a condition for a normal operation when all the signals S1 through S3 are LOW. In this case, an output of the NOR circuit 39 is HIGH, so that the NAND circuits 31 and 32 take a NAND operation between one of the signals FX0 and FX1 and an inverse of the other one of the signals FX0 and FX1. Further, the NAND circuits 33 and 34 serve as inverters to invert outputs of the NAND circuits 31 and 32, respectively. As a result, the device-type selecting signal DX0 is a product of an AND operation between the signal FX1 and an inverse signal /FX0, which is an inverse of the signal FX0. Further, the device-type selecting signal DX1 is a product of an AND operation between the signal FX0 and an inverse signal /FX1, which is an inverse of the signal FX1.

If at least one of the signals S1 through S3 becomes HIGH, the device-type selecting circuit 12 is placed in a condition for a test operation. In this case, the output of the NOR circuit 39 is LOW, so that the NAND circuits 31 and 32 produce HIGH outputs irrespective of the signals FX0 and FX1 from the fuse circuit 11. The NAND circuits 33 and 34 thus operate as inverters with respect to the outputs from the inverters 37 and 38. That is, the device-type selecting signal DX0 becomes the signal S1, and the device-type selecting signal DX1 becomes the signal S2.

Figure 3:
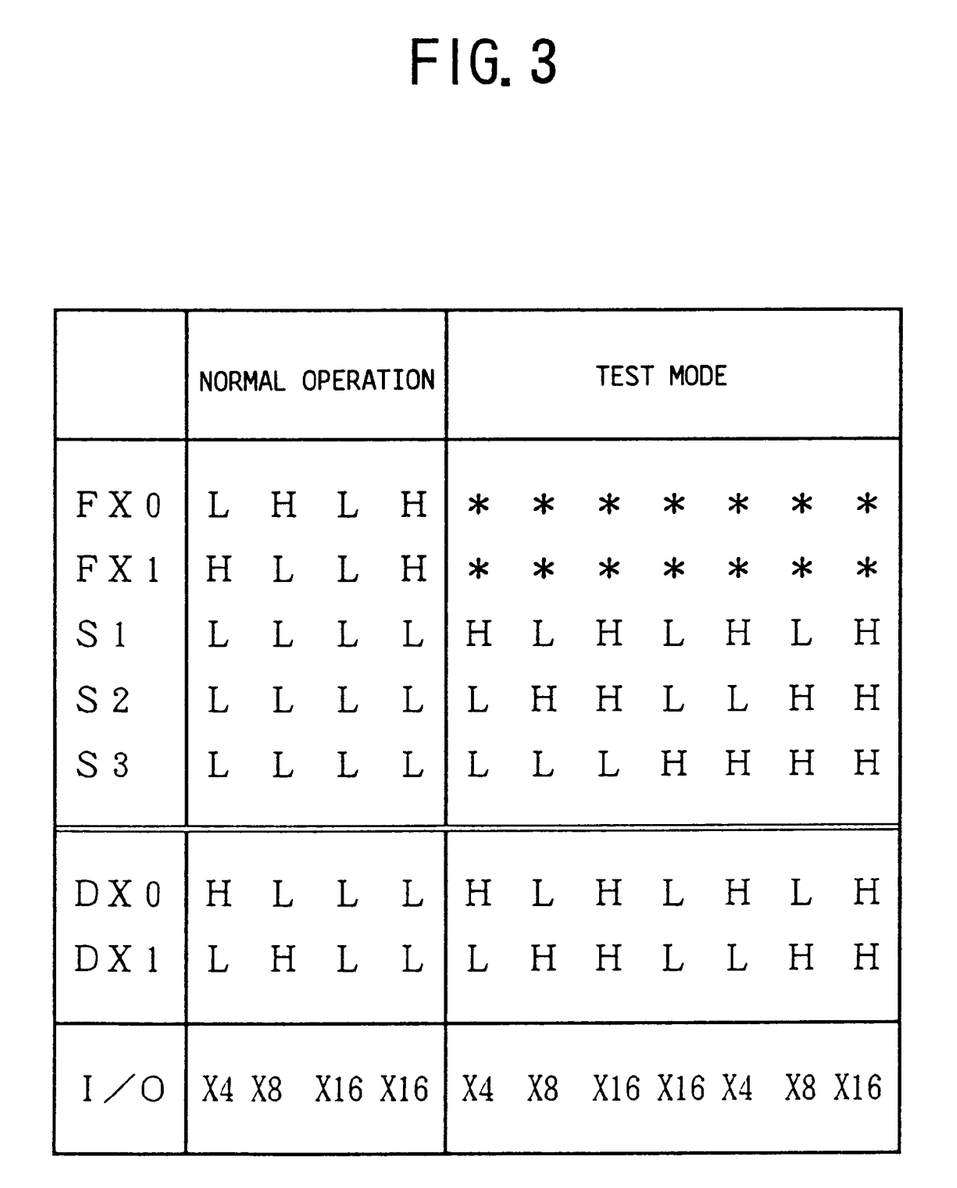
FIG. 3 is a table chart showing signal combinations for selecting one of a 4-bit configuration, an 8-bit configuration, and a 16-bit configuration as an input-output-interface configuration.

FIG. 3 is a table chart showing signal combinations for selecting one of a 4-bit configuration, an 8-bit configuration, and a 16-bit configuration as an input-output-interface configuration. As shown in FIG. 3, the signals S1 through S3 are set to LOW when the normal operation is to be selected. In this case, the device-type selecting signals DX0 and DX1 only depend on the signals FX0 and FX1 from the fuse circuit 11. A selected interface configuration is shown in FIG. 3 with respect to each of the combinations of the device-type selecting signals DX0 and DX1. When the device-type selecting signals DX0 and DX1 are LOW and HIGH, for example, the 8-bit configuration is selected.

When at least one of the signals S1 through S3 are set to HIGH, the test operation is underway. In this case, the device-type selecting signals DX0 and DX1 are determined based on the signals S1 through S3 regardless of the signals FX0 and FX1 from the fuse circuit 11. A selected interface configuration is shown in FIG. 3 with respect to each of the combinations of the signals S1 through S3. When the signals S1 through S3 are LOW, HIGH, and LOW, for example, the 8-bit configuration is selected.

Figure 4:
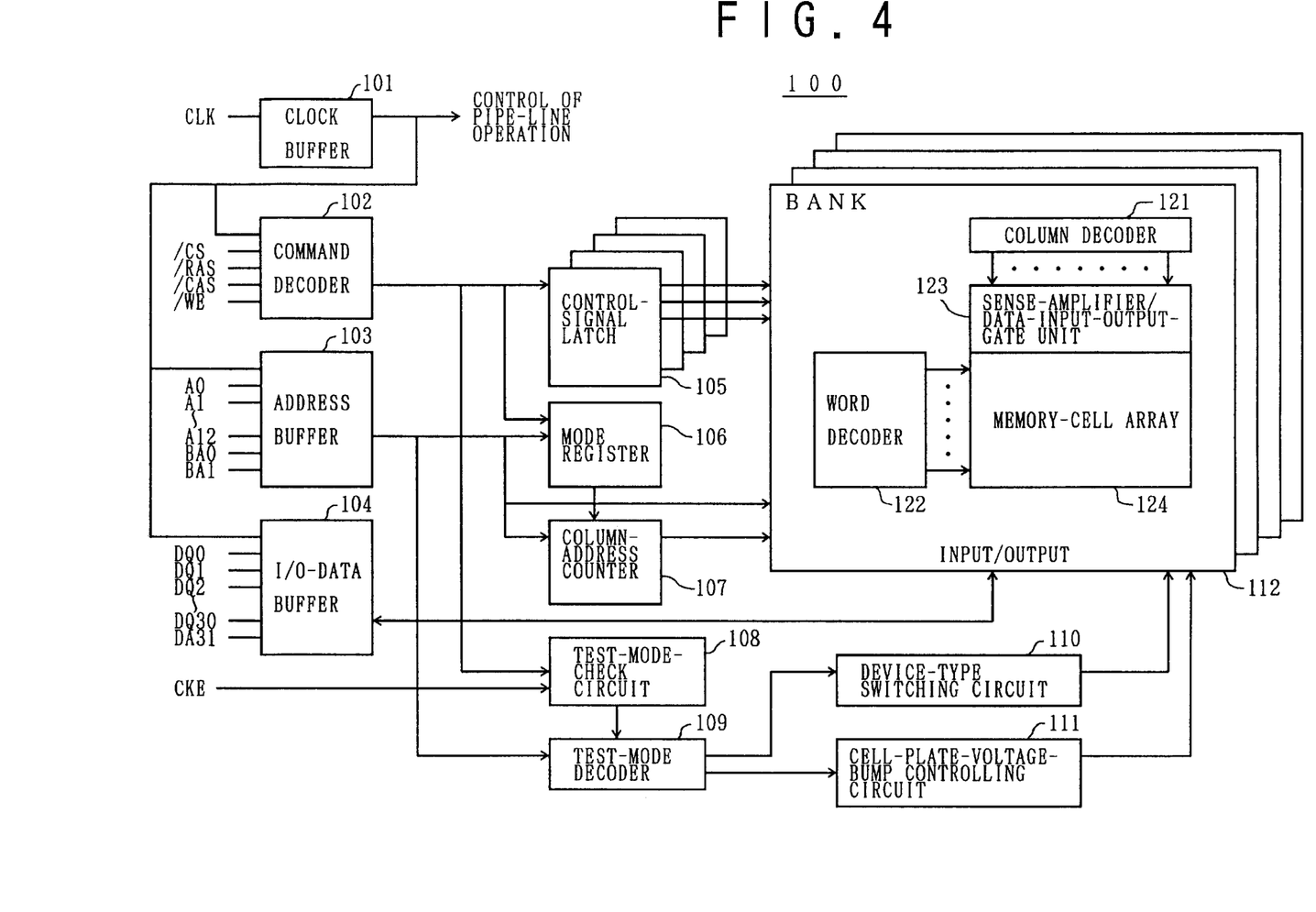
FIG. 4 is a block diagram of a semiconductor memory device such as a DRAM in which the device-type switching circuit of the present invention is employed.

FIG. 4 is a block diagram of a semiconductor memory device such as a DRAM in which the device-type switching circuit of the present invention is employed.

A semiconductor memory device 100 of FIG. 4 includes a clock buffer 101, a command decoder 102, an address buffer 103, an I/O-data buffer 104, a control-signal latch 105, a mode register 106, a column-address counter 107, a test-mode-check circuit 108, a test-mode decoder 109, a device-type switching circuit 110, a cell-plate-voltage-BUMP controlling circuit 111, and banks 112. A bank 112 includes a column decoder 121, a word decoder 122, a sense-amplifier/data-input-output-gate unit 123, and a memory-cell array 124.

The clock buffer 101 receives a clock signal CLK, and supplies it as a synchronization signal to the command decoder 102, the address buffer 103, and the I/O-data buffer 104. The clock buffer 101 also supplies synchronization signals for operation control to internal circuits of the semiconductor memory device 100.

The command decoder 102 receives control signals /CS (chip select), /RAS (row address strobe), /CAS (column address strobe), and /WE (write enable), and decodes these control signals. The command decoder 102 supplies a decoding result to the control-signal latch 105, the mode register 106, and the test-mode-check circuit 108. The control-signal latch 105 latches the decoding result provided from the command decoder 102, so that the banks 112 are controlled based on the latched decoding results.

The address buffer 103 receives address signals A0–A12, BA0, and BA1, and supplies these address signals to the mode register 106, the banks 112, and the test-mode decoder 109. As shown in FIG. 4, four banks 112, for example, may be provided, and one of the banks 112 is selected based on the bank address BA0 and BA1. The mode register 106 stores parameters for indicating CAS latency, a burst length, etc. An instruction to write parameters is given to the mode register 106 by a control signal, and the contents of parameters are specified by address signals.

The column-address counter 107 successively generates consecutive column addresses when successive column addresses are to be accessed at the same row address, and supplies the generated column addresses to the banks 112.

In one of the banks 112, the word decoder 122 reads data from memory cells of the memory-cell array 124 which are indicated by the supplied row address, and the data is stored in sense amplifiers of the sense-amplifier/data-input-output-gate unit 123. The column decoder 121 opens data-input-output gates of the sense-amplifier/data-input-output-gate unit 123, and supplies data of a sense amplifier corresponding to the supplied column address to the I/O-data buffer 104. When data is written, operations which are reverse to the above described operations are carried out.

The I/O-data buffer 104 is a buffer used for inputting and outputting data signals DQ0 through DQ31.

The test-mode-check circuit 108 receives the decoding result from the command decoder 102, and, also, receives a signal /CKE. Based on the decoding result and the signal /CKE, the test-mode-check circuit 108 determines whether an operation mode is the test operation mode or the normal operation mode. In detail, the operation mode is the test operation mode when all the control signals /RAS, /CAS, /WE, and /CS are LOW, and the signal /CKE is at a super high level, which is a voltage higher than the power voltage VCC.

The test-mode decoder 109 decodes the address signals from the address buffer 103 when the test-mode-check circuit 108 finds that the operation mode is the test operation mode. A bit pattern of the address signal determines what kind of test is conducted. The test-mode decoder 109 supplies the decoding results as control signals to the device-type switching circuit 110 and the cell-plate-voltage-BUMP controlling circuit 111. In this manner, the type of the test can be specified by the address signals, and the device-type switching circuit 110 and the cell-plate-voltage-BUMP controlling circuit 111 can be controlled accordingly. The test-mode decoder 109 is a simple decoder, and is well within ordinary skill in the art. A detailed description of the test-mode decoder 109 will be omitted.

The device-type switching circuit 110 is a circuit combining the device-type switching circuit 10 of FIG. 2 with the device-type switching decoder of FIG. 1, for example. The device-type switching circuit 110 fixes an input-output-interface configuration for the normal operation mode by cutting fuses, and, at the same time, can switch the input-output-interface configuration based on the control signals from the test-mode decoder 109 in the test operation mode. The control signals are comprised of the signals S1 through S3 of FIG. 2. When at least one of these signals is HIGH, the input-output-interface configuration is determined by the signal levels of the signals S1 through S3 irrespective of fuse conditions.

The cell-plate-voltage-BUMP controlling circuit 111 is used for conducting a data-read/write test under a condition that a cell plate is set to the ground voltage VSS or the power voltage VCC. The cell-plate-voltage-BUMP controlling circuit 111 sets the cell plate to the ground voltage VSS or the power voltage VCC in accordance with the control signals supplied from the test-mode decoder 109. The cell plate is provided to face the memory-cell array 124, and is kept at a middle voltage during normal operations. During a test operation, the cell plate is set to the power voltage VCC, for example, to make a deliberate condition in which a current leak is likely to occur with respect to cells of the memory-cell array 124. Under this condition, a data-read/write test is conducted to check if cells are sturdy enough in terms of current leaks.

In the semiconductor memory device 100 of FIG. 4, the cutting of fuses in the device-type switching circuit 110 determines the input-output-interface configuration of the normal operation mode. Compared to the related art method of switching a device type by bonding pads, therefore, the present invention can spare chip areas which would otherwise be used as pad areas. Further, the input-output-interface configuration can be temporarily switched by providing particular address signals during the test operation mode, so that a time required for data input and output during the test operations can be significantly reduced.

Figure 5:
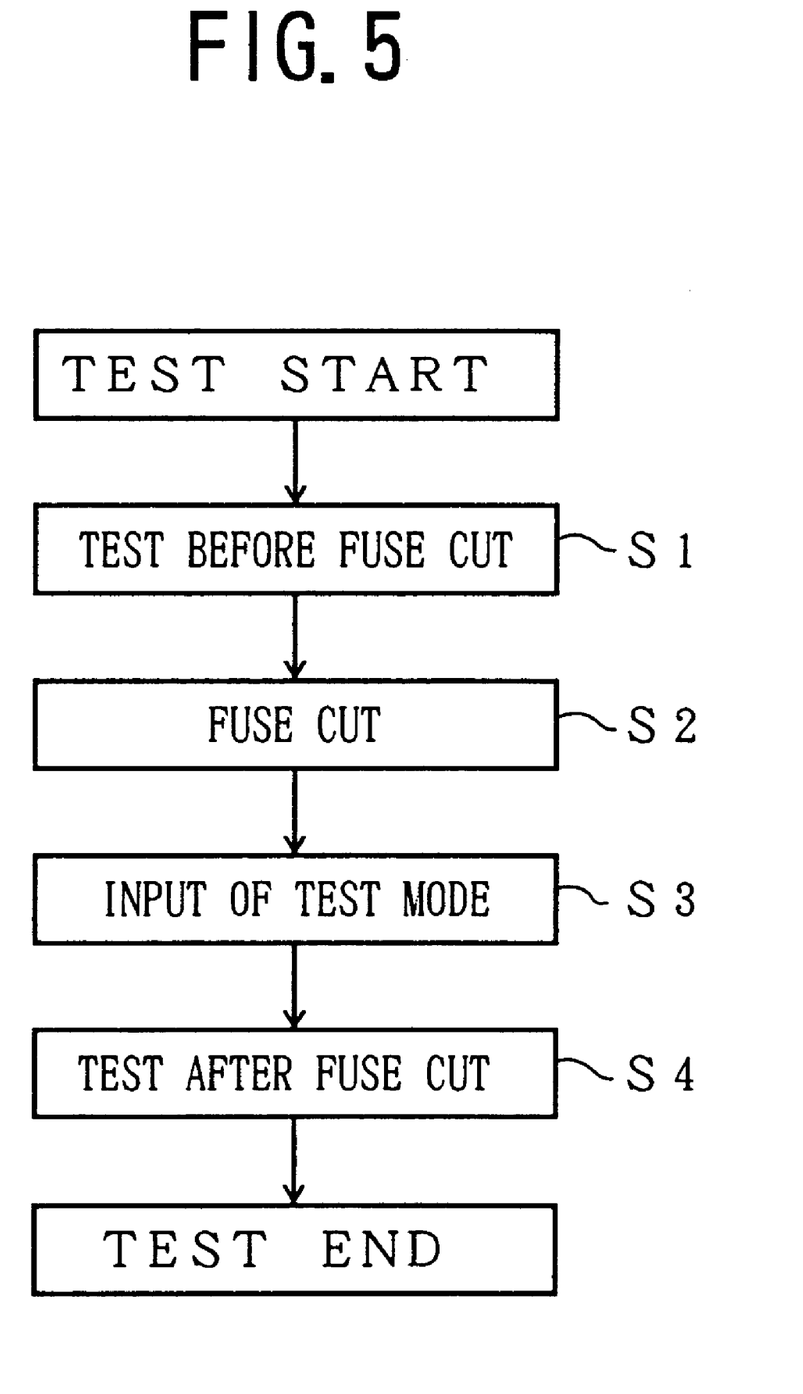
FIG. 5 is a flowchart of a procedure of a test conducted for the semiconductor memory device of FIG. 4 which,if,is provided with the device-type switching circuit of the present invention.

FIG. 5 is a flowchart of a procedure of a test conducted for the semiconductor memory device 100 which is provided with the device-type switching circuit 110 of the present invention.

At a step S1, tests are conducted prior to cutting fuses. The tests before severing fuses include a test to write data in and read the data from memory cells so as to identify defective cells which need to be replaced by redundant cells. The redundant cells are provided to allow addresses to be converted through fuse cuts so that an alternate cell is accessed when an address of a defective cell is selected.

At a step S2, fuses are cut. This step includes cutting fuses for redundant-cell replacement described in the above and cutting fuses for fixing the input-output-interface configuration in the device-type switching circuit.

At a step S3, a test mode is input in order to conduct tests after the fuse cut.

Figure 6:
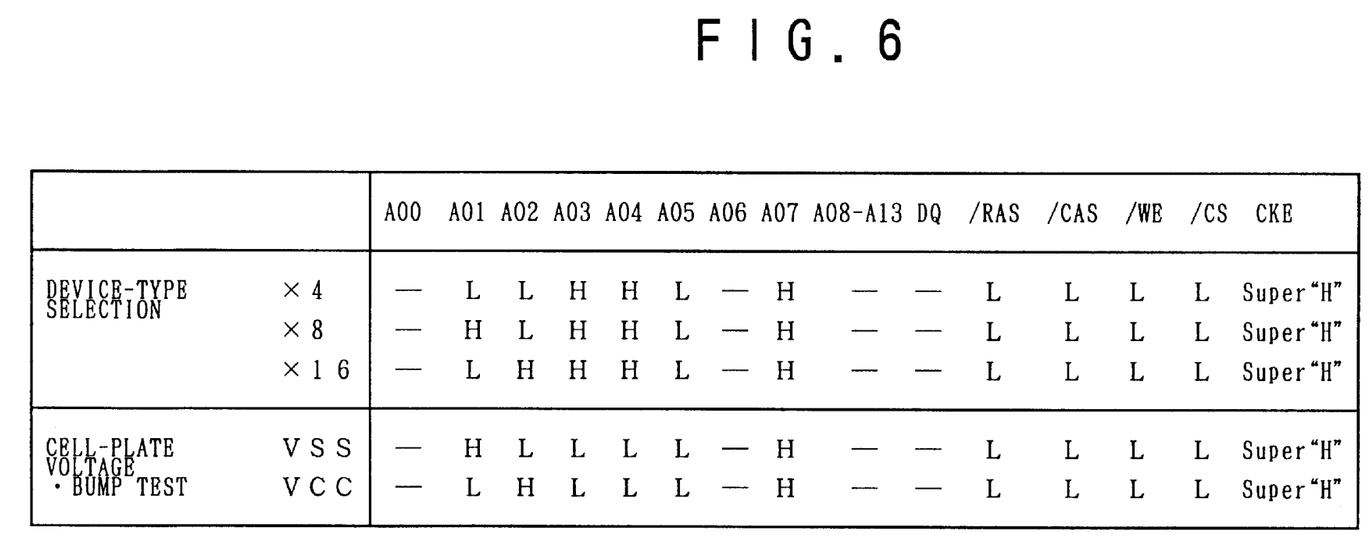
FIG. 6 is a table chart showing examples of test-mode inputs.

FIG. 6 is a table chart showing examples of test-mode inputs. As shown in FIG. 6, if the input-output-interface configuration is to be set to a 16-bit configuration, the address signals A01 through A05 must be set to LOW, HIGH, HIGH, HIGH, and LOW, respectively, and the address signal A07 must be set to HIGH. As was described in connection with FIG. 4, all the control signals /RAS, /CAS, /WE, and /CS need to be LOW, and the signal /CKE needs to be at a super-high level in order to select a test mode.

At a step S4, tests are conducted after the fuse cut. The tests include checking whether written data and read data coincide with each other after writing data at an indicated address and reading the data from the indicated address. Even if the input-output-interface is fixed to a 4-bit configuration by the fuse cut at the step S2, for example, the interface can be switched to a 16-bit configuration by the test-mode input at the step S3. This allows high-speed data-write/read operations, thereby completing the test in a relatively short time.

If a test on a current leakage of the memory cells needs to be conducted by writing and reading data while a cell plate is set to a predetermined voltage, a test mode for setting a cell-plate voltage may be input at the step S3 following entry of the test mode for specifying the input-output-interface configuration. Namely, if the cell plate voltage is to be set to the ground voltage VSS, for example, the address signals A01 through A05 must be set to HIGH, LOW, LOW, LOW, and LOW, and the address signal A07 must be set to HIGH. At the same time, all the control signals /RAS, /CAS, /WE, and /CS are kept at a LOW level, and the signal /CKE is set at the super-high level in the same manner as in the previous example.

As described in the above, the present invention can switch the input-output-interface configuration at the time of tests after the fuse cut, thereby allowing use of a larger number of input-output-data bits. Compared to the case in which there is no choice but to use the input-output-interface fixed by the fuse cut, the present invention can reduce a time required for the data input and output by a significant amount.

Further, the present invention is not limited to these embodiments, but various variations and modifications may be made without departing from the scope of the present invention.

What is claimed is:

1. A semiconductor device comprising:
    a device-type switching circuit outputting selection signals in response to fuse-cut conditions in a first mode, and outputting said selection signals in response to control signals supplied thereto in a second mode; and
    an internal circuit having an operation type selected by said selection signals from said device-type switching circuit.

2. The semiconductor device as claimed in claim 1, wherein said device-type switching circuit comprises:
    a fuse circuit which fixes at least one output thereof according to said fuse-cut conditions; and
    a device-type selecting circuit which receives said at least one output and said control signals, said device-type selecting circuit determining said selection signals based on said at least one output in said first mode and determining said selection signals based on said control signals in said second mode.

3. The semiconductor device as claimed in claim 1, wherein said device-type switching circuit selects one of said first mode and said second mode based on said control signals.

4. The semiconductor device as claimed in claim 1, wherein said internal circuit selects one of a plurality of input-output-interface configurations in accordance with said selection signals.

5. The semiconductor device as claimed in claim 4, further comprising:
    a mode-check circuit checking whether an operation mode is a normal operation mode or a test operation mode; and
    a mode-decoder circuit which generates said control signals by decoding input signals supplied from an external source when said operation mode is said test operation mode,
    wherein said normal operation mode corresponds to said first mode, and said test operation mode corresponds to said second mode.

6. A method of testing operations of a semiconductor device which selects one of input-output-interface configurations based on fuse-cut conditions in a normal operation mode and selects one of said input-output-interface configurations based on input signals in a test operation mode, said method comprising the steps of:
    cutting at least one fuse to select a first one of said input-output-interface configurations;
    inputting a command to specify said test operation mode and to select a second one of said input-output-interface configurations; and
    testing operations of said semiconductor device by using said second one of said input-output-interface configurations.

7. The method as claimed in claim 6, wherein said second one of said input-output-interface configurations includes a larger number of input-output bits than said first one of said input-output-interface configurations.

8. A semiconductor device which determines a device type thereof based on cut conditions of internal fuses in a first mode and determines said device type based on input signals supplied from an external source in a second mode.

9. The semiconductor device as claimed in claim 8, wherein said device type is classified according to input-output-interface configurations.

10. The semiconductor device as claimed in claim 8, wherein said first mode is a normal operation mode and said second mode is a test operation mode.

* * * * *